(12) United States Patent
Shao et al.

(10) Patent No.: US 7,883,999 B2
(45) Date of Patent: Feb. 8, 2011

(54) METHOD FOR INCREASING THE PENETRATION DEPTH OF MATERIAL INFUSION IN A SUBSTRATE USING A GAS CLUSTER ION BEAM

(75) Inventors: Yan Shao, Andover, MA (US); Thomas G. Tetreault, Manchester, NH (US); John J. Hautala, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 12/020,094

(22) Filed: Jan. 25, 2008

(65) Prior Publication Data
US 2009/0191696 A1 Jul. 30, 2009

(51) Int. Cl.
*H01L 21/265* (2006.01)
(52) U.S. Cl. ............... 438/519; 438/514; 257/E21.141
(58) Field of Classification Search ............ 438/185, 438/914, 37, 232, 371–375, 45, 181, 473–474, 438/510, 514, 519, 522, 527, 530–531, 151; 257/E21.135–E21.153
See application file for complete search history.

(56) References Cited

U.S. PATENT DOCUMENTS

| | | | |
|---|---|---|---|
| 4,361,762 A | 11/1982 | Douglas | |
| 4,886,971 A | 12/1989 | Matsumura et al. | |
| 4,916,311 A | 4/1990 | Fuzishita et al. | |
| 5,907,780 A | 5/1999 | Gilmer et al. | |
| 6,391,731 B1 * | 5/2002 | Chong et al. | 438/303 |
| 7,259,036 B2 | 8/2007 | Borland et al. | |
| 7,288,491 B2 | 10/2007 | Collins et al. | |
| 7,410,890 B2 * | 8/2008 | Kirkpatrick et al. | 438/510 |
| 2002/0130275 A1 | 9/2002 | Mack et al. | |
| 2005/0147762 A1 | 7/2005 | Dubin et al. | |
| 2005/0181621 A1 | 8/2005 | Borland et al. | |
| 2005/0202657 A1 * | 9/2005 | Borland et al. | 438/514 |
| 2005/0277246 A1 * | 12/2005 | Kirkpatrick et al. | 438/232 |
| 2006/0292762 A1 * | 12/2006 | Borland et al. | 438/151 |

FOREIGN PATENT DOCUMENTS

JP 62296357 A 12/1987

OTHER PUBLICATIONS

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.
Yamada, I. et al., Surface modification with gas cluster ion beams, Nuclear Instruments & Methods in Physics Research, vol. B79, Nov. 2, 1992, pp. 223-226, XP001031961, ISSN: 0168-583X.
Yamada, I. et al., Materials processing by gas cluster ion beams, vol. 34, May 30, 2001, pp. 231-295.

* cited by examiner

*Primary Examiner*—Matthew C Landau
*Assistant Examiner*—Jessica Hall
(74) *Attorney, Agent, or Firm*—Wood, Herron & Evans, LLP (57) ABSTRACT

A method for infusing material below the surface of a substrate is described. The method comprises modifying a surface condition of a surface on a substrate to produce a modified surface layer, and thereafter, infusing material into the modified surface in the substrate by exposing the substrate to a gas cluster ion beam (GCIB) comprising the material.

25 Claims, 4 Drawing Sheets

METHOD FOR INCREASING THE PENETRATION DEPTH OF MATERIAL INFUSION IN A SUBSTRATE USING A GAS CLUSTER ION BEAM

BACKGROUND OF THE INVENTION

1. Field of Invention

The invention relates to a method for infusing material in a substrate using a gas cluster ion beam (GCIB), and more particularly to a method for increasing the penetration depth and dose of material infusion by modifying a surface condition of the substrate prior to the infusion.

2. Description of Related Art

The useful characteristics of semiconductor materials, such as silicon, germanium and gallium arsenide as well as other semiconductors, are contingent upon the purity and crystal structure of the semiconductor material. Dopant atoms incorporated into semiconductor materials for the purpose of altering electrical properties, forming electronic junctions, etc., are often introduced into a semiconductor surface by conventional ion implantation.

During the conventional process of ion implantation, ionized dopant atoms are physically deposited into a crystalline semiconductor material, but it is well known that, in doing so, the crystal lattice of the semiconductor becomes damaged by the implantation process. In order for the implanted dopant atoms to become electrically active within the semiconductor and to restore the desirable crystallinity of the semiconductor, the semiconductor crystal lattice structure must be restored and the implanted dopant atoms must occupy lattice sites within the restored crystal lattice by substitution. Processes typically employed to produce crystal lattice restoration and electrical activation of implanted dopant atoms include elevated temperature thermal annealing, pulsed laser beam annealing and pulsed electron beam annealing.

For some semiconductor products, an important requirement for the introduction of dopants into the semiconductor surface is that the maximum depth to which the dopant has penetrated after completion of the lattice re-crystallization and dopant activation processes must be kept very shallow, often only a few hundred Angstroms or less. By using very low energy conventional ion implantation, such shallow introduction of dopant is feasible by using very low implantation energies on the order of less than 1000 eV or in some cases even less than 200 eV. However, at such low energy, conventional ion implant often suffers from an energy contamination problem. When implanting some dopant, such as boron (B), a channeling effect is unavoidable unless the silicon (Si) lattice is pre-amorphized before dopant implant. In conventional ion implant, this technique is known as pre amorphization implant (PAI). High energy germanium (Ge) is often used for such purpose. The Ge PAI not only helps to prevent channeling but also helps to reduce B diffusion during anneal. But Ge PAI causes implant damage, often referred to as end-of-range damage that can not be corrected by annealing. Such end of range damage results in high leakage current and other negative effect to devices.

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases.

Therefore, one emerging application includes the infusion of a material, such as a dopant, within a very shallow surface region of a substrate or thin film on the substrate using a GCIB. Therein, the amount of material that is infused within the substrate is related to the dose of the GCIB processing, while the penetration depth of the material infusion is related to the energy level of the GCIB processing.

SUMMARY OF THE INVENTION

The invention relates to a method for infusing material into the surface of a substrate using a gas cluster ion beam (GCIB).

The invention further relates to a method that comprises modifying a condition of the surface on a substrate to produce a modified surface layer, and thereafter, infusing material into the modified surface layer in the substrate by exposing the substrate to a gas cluster ion beam (GCIB) comprising the material. The modification of the surface of the substrate may comprise amorphization of a crystalline surface, introduction of an inert material, for example a noble gas element, into the surface, exposure to a pre-treatment GCIB different than the GCIB for infusing the material, exposure to an ion beam of non-clustered ions to cause ion implantation, and/or exposure to plasma to cause plasma immersion ion implantation.

According to one embodiment, a method for infusing material within a surface of a substrate is described, comprising: treating a surface on a substrate using a first GCIB in order to modify a surface condition of the surface on the substrate to produce a modified surface layer; and infusing material into the modified surface layer in the substrate by exposing the substrate to a second GCIB comprising the material after the treating.

DETAILED DESCRIPTION OF SEVERAL EMBODIMENTS

A method and system for performing material infusion into a substrate using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

As described above, there exists a growing need for infusing material into an ultra-shallow layer in the surface of a substrate. In order to achieve such ultra-shallow penetration depths, one approach includes using a GCIB. By adjusting the dose of the GCIB, the concentration of material infusion into the substrate may be varied. Further, by adjusting the beam energy of the GCIB, the penetration depth of material infusion into the substrate may be varied. However, the dependence of the penetration depth on the beam energy is relatively weak. For example, the maximum penetration depth ($\delta$) is approximately proportional to the cube root of the beam energy (E) (i.e., $\delta \sim E^{1/3}$). Hence, the range of beam energy required to achieve practical ranges for penetration depth may become excessive.

Therefore, according to one embodiment, a method for increasing the penetration depth of GCIB material infusion is provided that comprises first modifying the surface condition (properties) of a substrate thereby producing a modified surface layer, and thereafter, infusing material into the modified surface layer in the substrate by exposing the substrate to a gas cluster ion beam (GCIB) comprising the material.

According to one embodiment, the substrate comprises a crystalline material, and the modification of the surface of the substrate causes amorphization of the surface to form the modified surface layer. For example, amorphization may be achieved using a pre-treatment GCIB. According to another embodiment, the modification of the surface of the substrate comprises introducing an inert material into the surface, for example, introducing argon into the surface, to form the modified surface layer. According to yet another embodiment, the modification of the surface of the substrate comprises introducing a noble gas element into the surface to form the modified surface layer. According to still another embodiment, the modification may comprise one or a combination of: exposing the substrate to a pre-treatment GCIB that is different than the GCIB used to infuse the material into the modified surface layer; exposing the substrate to an ion beam that is substantially composed of non-clustered ions to cause ion implantation; or exposing the substrate to plasma to cause plasma immersion ion implantation.

Figure 1:
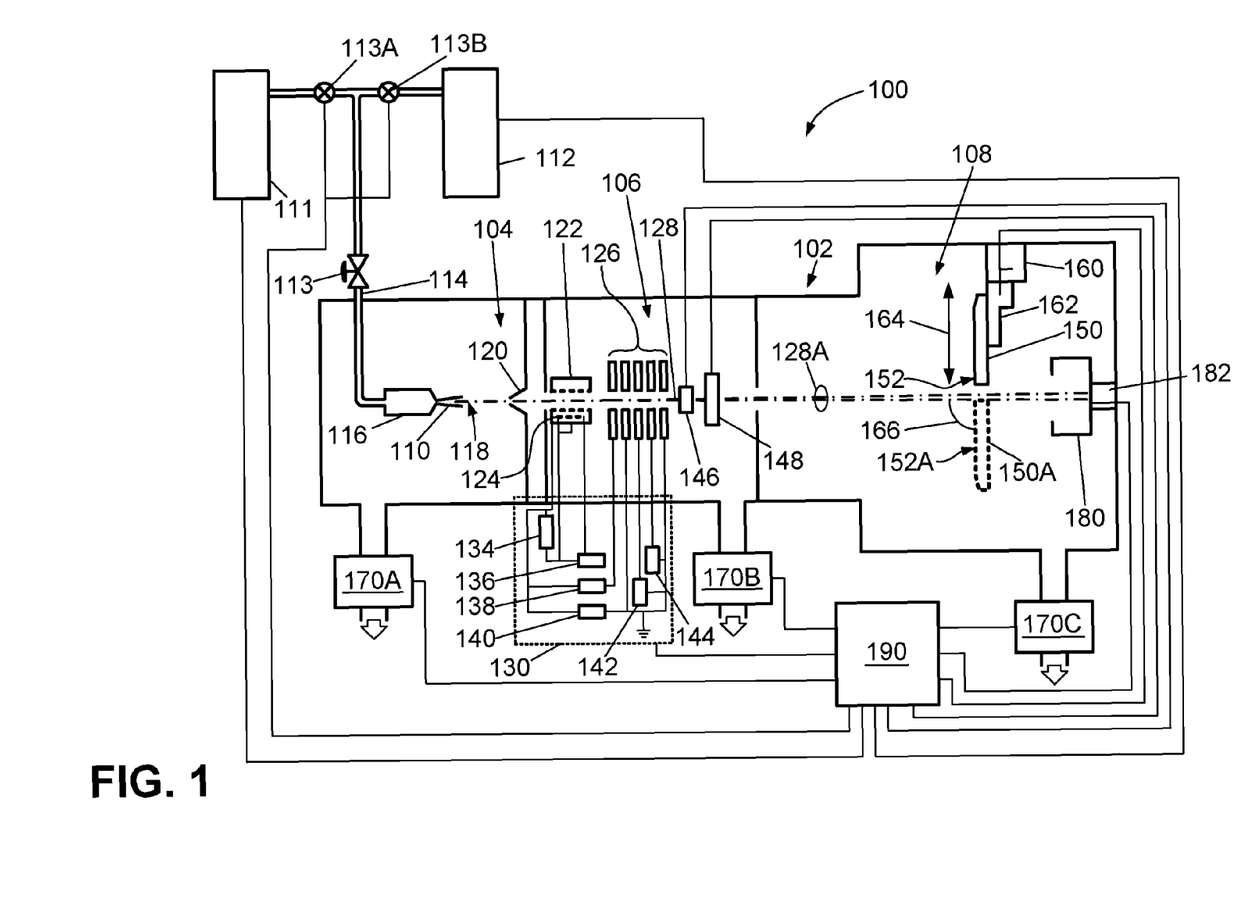
FIG. 1 is an illustration of a GCIB processing system.

According to an embodiment, a GCIB processing system 100 is depicted in FIG. 1 comprising a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a gas cluster ion beam can be formed in the second chamber (ionization/acceleration chamber 106) wherein the gas cluster beam is ionized and optionally accelerated, and then in the third chamber (processing chamber 108) the accelerated or non-accelerated gas cluster ion beam may be utilized to treat substrate 152.

As shown in FIG. 1, GCIB processing system 100 can comprise one or more gas sources configured to introduce one or more gases or mixture of gases to vacuum vessel 102. A first gas composition stored in a first gas source 111 is admitted under pressure through a first gas control valve 113A to a gas metering valve or valves 113. Additionally, an optional second gas composition stored in a second gas source 112 is admitted under pressure through a second gas control valve 113B to the gas metering valve or valves 113. According to one example, the first gas composition can include a condensable inert gas. For example, the inert gas can include a noble gas, i.e., He, Ne, Ar, Kr, Xe, or Rn. Additionally, according to another example, the second gas composition can comprise a chemical composition having the material to be infused in the substrate.

Furthermore, the first gas source 111 and the second gas source 112 may be utilized either alone or in combination with one another to produce ionized clusters comprising helium, neon, argon, krypton, xenon, nitrogen, oxygen, hydrogen, methane, nitrogen trifluoride, carbon dioxide, sulfur hexafluoride, nitric oxide, nitrous oxide, boron trifluoride, diborane, arsine, arsenic pentafluoride, phosphorous pentafluoride, phosphine, or stibine, or any combination of two or more thereof. For example, during the infusion of a dopant into a semiconductor substrate or layer, the first gas source 111 and the second gas source 112 may be utilized either alone or in combination with one another to produce ionized clusters comprising a boron-containing specie, a phosphorous-containing specie, an arsenic-containing specie, or an antimony-containing specie, or any combination of two or more thereof, and optionally a noble gas, such as He or Ar.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 70 kV.

As illustrated in FIG. 1, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
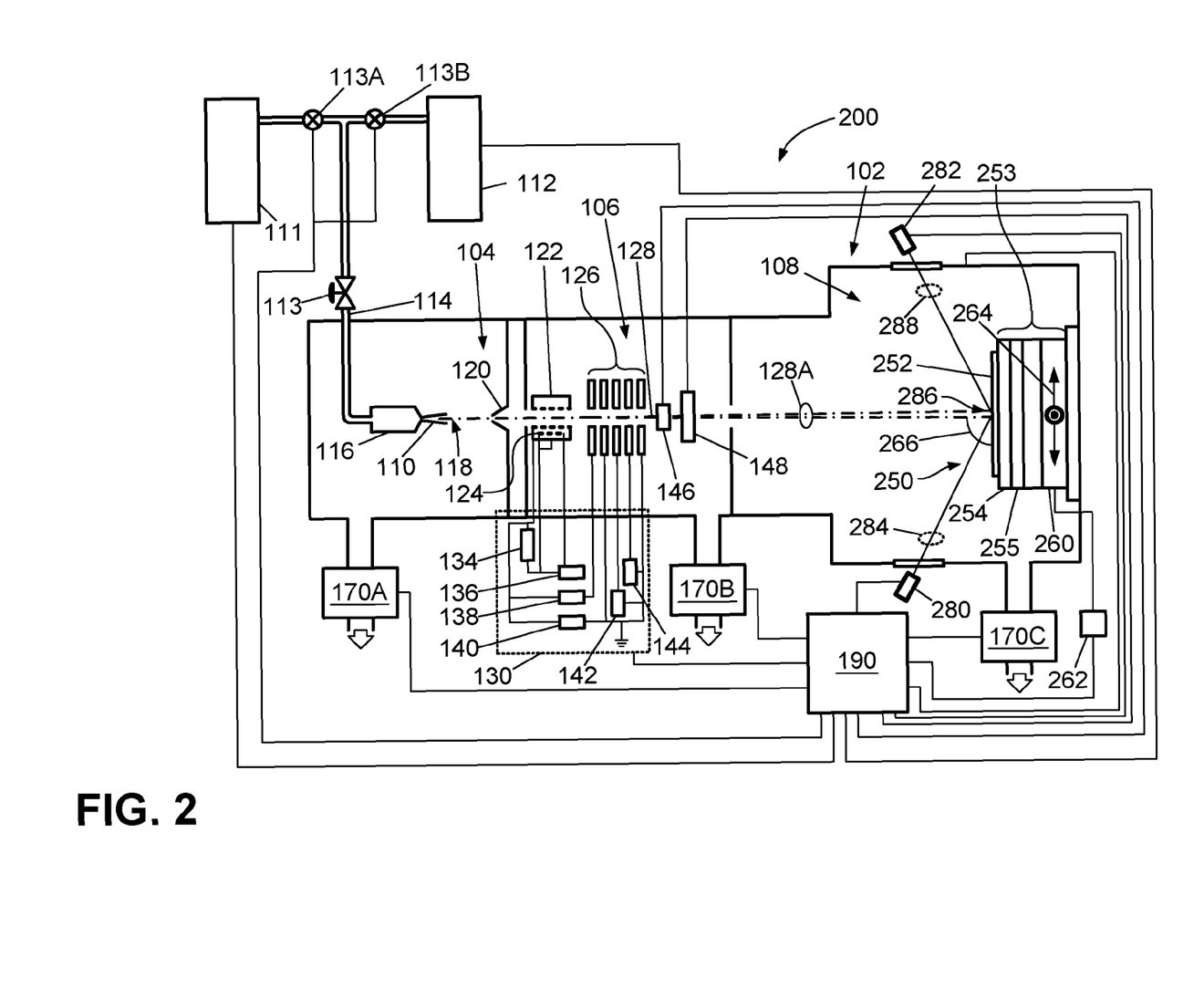
FIG. 2 is another illustration of a GCIB processing system.

In the embodiment shown in FIG. 2, the GCIB processing system 200 can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the substrate 252 surface. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown) may be used to assure accurate dosimetry despite the added source of electrical charge the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 200 by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 200. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Control system 190 comprises a microprocessor, memory, and a digital I/O port capable of generating control voltages sufficient to communicate and activate inputs to GCIB processing system 100 (or 200) a as well as monitor outputs from GCIB processing system 100 (or 200). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 200), or it can be remotely located relative to the GCIB processing system 100 (or 200). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mtorr. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 3:
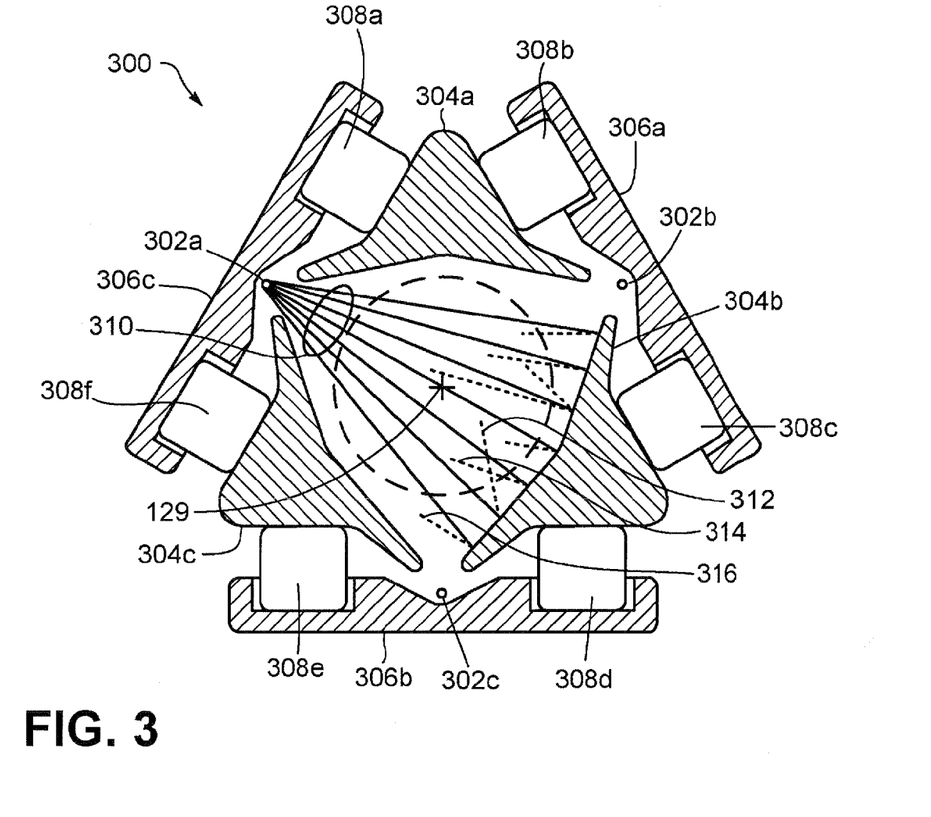
FIG. 3 is an illustration of an ionization source for a GCIB processing system.

Referring now to FIG. 3, a section 300 of a gas cluster ionizer (122, FIGS. 1 and 2) for ionizing a gas cluster jet (gas cluster beam 118, FIGS. 1 and 2) is shown. The section 300 is normal to the axis of GCIB 128. For typical gas cluster sizes (2000 to 15000 atoms), clusters leaving the skimmer aperture (120, FIGS. 1 and 2) and entering an ionizer (122, FIGS. 1 and 2) will travel with a kinetic energy of about 130 to 1000 electron volts (eV). At these low energies, any departure from space charge neutrality within the ionizer 122 will result in a rapid dispersion of the jet with a significant loss of beam current. FIG. 3 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar.

Figure 4:
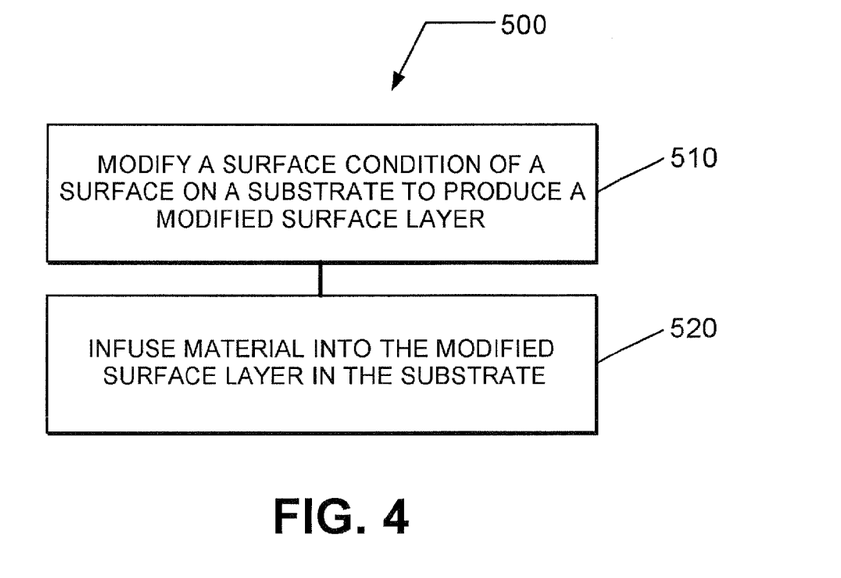
FIG. 4 illustrates a method of infusing material in a substrate according to another embodiment.

Referring now to FIG. 4, a method for infusing material within a surface of a substrate is illustrated according to another embodiment. The method includes a flow chart 500 beginning in 510 with modifying a surface condition of a surface on a substrate to produce a modified surface layer. For example, the surface modification may include amorphization of a crystalline surface, introduction of an inert element into the surface, a GCIB pre-treatment, ion implantation using an ion beam of non-clustered ions, and/or plasma immersion ion implantation. The substrate may or may not comprise one or more thin films, structures or features, etc. The substrate may include conductive materials, semi-conductive materials, or dielectric materials, or any combination of two or more thereof. For example, the substrate may include a semiconductor material, such as silicon or germanium or a combination thereof. Additionally, the substrate may include an amorphous material or a crystalline material. Further, the substrate may include an amorphous layer or a crystalline within which material infusion is desired.

In one embodiment, the surface modification to the surface of the substrate may include pre-treating the surface of the substrate by exposing the substrate to a pre-treatment GCIB comprising a noble gas element. Alternatively, the surface modification to the surface of the substrate may include pre-treating the surface of the substrate by exposing the substrate to a pre-treatment GCIB containing a noble gas element and not containing the material to be infused. Alternatively, the surface modification to the surface of the substrate may include pre-treating the surface of the substrate by exposing the substrate to a pre-treatment GCIB consisting essentially of a noble gas element. Alternatively, the surface modification to the surface of the substrate may include pre-treating the surface of the substrate by exposing the substrate to a pre-treatment GCIB consisting of a noble gas element. Alternatively yet, the surface modification to the surface of the substrate may include pre-treating the surface of the substrate by exposing the substrate to a pre-treatment GCIB consisting of argon.

Furthermore, the pre-treatment process may include: maintaining a reduced-pressure environment around a substrate holder for holding the substrate having the surface; holding the substrate securely within the reduced-pressure environment; providing to the reduced-pressure environment the pre-treatment GCIB from a pressurized gas mixture comprising the noble gas element; accelerating the pre-treatment GCIB to a pre-treatment beam energy; and irradiating the accelerated pre-treatment GCIB onto at least a portion of the surface of the substrate to alter the surface condition of the surface.

The pre-treatment beam energy may be greater than about 5 keV. Alternatively, the pre-treatment beam energy may be greater than about 10 keV. Alternatively, the pre-treatment beam energy may be greater than about 20 keV. Alternatively yet, the pre-treatment beam energy may be greater than about 30 keV.

In 520, after the surface condition modification, material is infused into the modified surface layer in the substrate by exposing the substrate to a gas cluster ion beam (GCIB) comprising the material. The material may include a dopant for use in semiconductor applications. For example, the material may include boron (B), phosphorous (P), arsenic (As), or antimony (Sb), or any combination of two or more thereof.

The infusion process may include: maintaining a reduced-pressure environment around a substrate holder for holding the substrate having the surface; holding the substrate securely within the reduced-pressure environment; providing to the reduced-pressure environment the GCIB from a pressurized gas mixture comprising the material; accelerating the GCIB to an infusion beam energy; and irradiating the accelerated GCIB onto at least a portion of the modified surface of the substrate to infuse the material into the modified surface.

The infusion beam energy may be greater than about 30 keV. Alternatively, the infusion beam energy may be greater than about 10 keV. Alternatively yet, the infusion beam energy may be greater than about 5 keV. Alternately yet, the infusion beam energy may be greater than about 1 keV.

According to another embodiment, a method for infusing material within a surface of a substrate is described. The method comprises treating a surface on a substrate using a first GCIB in order to modify a surface condition of the surface on the substrate to produce a modified surface layer, and after the treating, infusing material into the modified surface layer in the substrate by exposing the substrate to a second GCIB comprising the material.

According to yet another embodiment, a method for patterning the infusion of material within a surface of a substrate is described. The method comprises forming a patterned mask layer on a surface of a substrate, treating the substrate using a first GCIB in order to modify a surface condition of the surface exposed through the patterned mask layer on the substrate to produce a modified surface layer, removing the patterned mask layer, and thereafter, infusing material into the substrate including areas having the modified surface layer and areas not having the modified surface layer by exposing the substrate to a second GCIB comprising the material. The use of a patterned mask layer during the substrate treatment with the first GCIB can facilitate patterning the distribution of the infusion depth or the distribution of the infusion dose or both across the substrate.

The patterned mask layer may be formed by coating the substrate with a layer of radiation-sensitive material, such as photo-resist. For example, photo-resist may be applied to the substrate using a spin coating technique, such as those processes facilitated by a track system. Additionally, for example, the photo-resist layer is exposed to an image pattern using a photo-lithography system, and thereafter, the image pattern is developed in a developing solvent to form a pattern in the photo-resist layer.

The photo-resist layer may comprise 248 nm (nanometer) resists, 193 nm resists, 157 nm resists, or EUV (extreme ultraviolet) resists. The photo-resist layer can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

The exposure to electro-magnetic (EM) radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

The photo-resist layer may be removed using a wet stripping process, a dry plasma ashing process, or a dry non-plasma ashing process.

The patterned mask layer may include multiple layers, wherein the pattern formed in the multi-layer mask layer may be created using wet processing techniques, dry processing techniques, or a combination of both techniques. The formation of a patterned mask layer having a single layer or multiple layers is understood to those skilled in the art of lithography and pattern etching technology.

Following the infusion of material, the method may further comprise post-processing steps. For example, these post-processing steps may include treating the infused layer to cause re-crystallization of the infused layer or activation of the infused material in the infused layer. The post-processing step may include treating the infused layer with another GCIB, elevated temperature thermal annealing, pulsed laser beam annealing, or pulsed electron beam annealing, or any combination of two or more thereof.

Figure 5A:
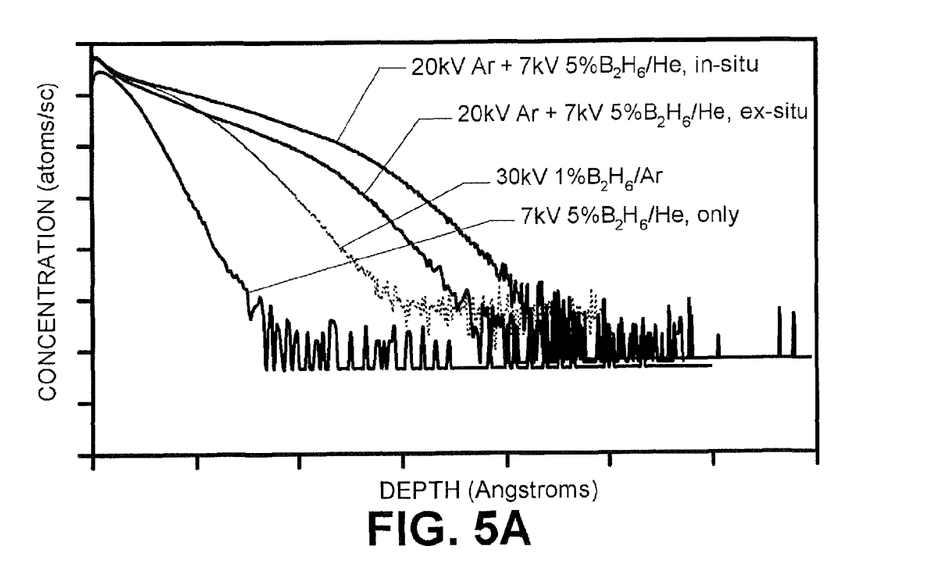
FIG. 5A provides exemplary data to illustrate the dependence of material concentration on depth.

Referring now to FIG. 5A, exemplary data is provided for infusing material within a surface of a substrate. In this example, boron (B) is infused within silicon (Si) using diborane ($B_2H_6$) as a precursor molecule. As shown in FIG. 5A, a profile of boron (B) concentration (atoms per square centimeter, sc) is presented as a function of depth (Angstroms) for four separate scenarios.

A first profile is provided for a GCIB comprising 5% by molar concentration $B_2H_6$ in He at a beam energy of 7 keV (without any surface modification) (labeled in FIG. 5A as "7 kV 5% $B_2H_6$/He, only"). A second profile is provided for a GCIB comprising 1% by molar concentration $B_2H_6$ in Ar at a beam energy of 30 keV (without any surface modification) (labeled in FIG. 5A as "30 kV 1% $B_2H_6$/Ar"). As a result of the increase in beam energy and the increase in the atomic mass of the dilutant, the penetration depth of the B concentration profile is marginally increased.

A third profile is provided for a first GCIB treatment comprising Ar at a first beam energy of 30 keV and a second GCIB treatment comprising 5% by molar concentration $B_2H_6$ in He at a beam energy of 7 keV (labeled in FIG. 5A as "30 kV Ar+7 kV 5% $B_2H_6$/He, ex-situ"). A fourth profile is provided for a first GCIB treatment comprising Ar at a first beam energy of 30 keV and a second GCIB treatment comprising 5% by molar concentration $B_2H_6$ in He at a beam energy of 7 keV (labeled in FIG. 5A as "30 kV Ar+7 kV 5% $B_2H_6$/He, in-situ"). The difference between the third profile and the fourth profile is that, during preparation of the third profile, the substrate is exposed to air between the first GCIB treatment and the second GCIB treatment.

In both profiles, the penetration depth of the B concentration profile is increased (significantly relative to the profile without any pre-treatment). Additionally, the comparison of the third profile and the fourth profile indicates that the penetration depth is sensitive to the surface properties of the substrate. For a silicon substrate, the penetration depth may be sensitive to whether or not an oxidized surface layer ($SiO_x$) exists. Further, the comparison of the second profile and the fourth profile indicates that the penetration depth is greater when the pre-treatment step exists and stands alone from the infusion step.

Moreover, inspection of the four profiles indicates that the B dose is also increased when the surface condition of the substrate is modified prior to infusion. For example, the B dose for the first profile is $1.21 \times 10^{15}$ atoms/sc (square centimeter), the B dose for the third profile is $2.80 \times 10^{15}$ atoms/sc, and the B dose for the fourth profile is $3.77 \times 10^{15}$ atoms/sc. The GCIB dose for the first, third and fourth B precursor infusion is held constant.

Figure 5B:
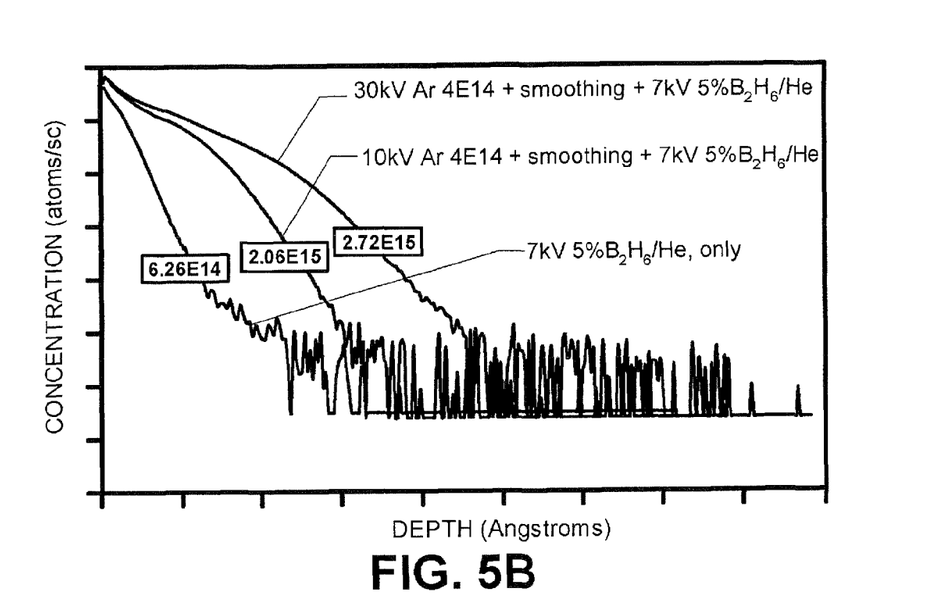
FIG. 5B provides additional exemplary data to illustrate the dependence of material concentration on depth.

Referring now to Table 1 and FIG. 5B, additional exemplary data is provided for infusing material within a surface of a substrate. In this example, boron (B) is infused within silicon (Si) using diborane ($B_2H_6$) as a precursor molecule. As shown in FIG. 5B, a profile of boron (B) concentration (atoms per square centimeter, sc) is presented as a function of depth (Angstroms) for three separate scenarios.

TABLE 1

| Case No. | Step No. | GCIB Dose ($1 \times 10^{15}$) | $I_{FC}$ (μA) | Energy (keV) | Gas 1 | Flow Rate 1 (sccm) | Gas 2 | Flow Rate 2 (sccm) | B Dose (atoms/sc) | Penetration Depth (A @ $1 \times 10^{18}$) |
|---|---|---|---|---|---|---|---|---|---|---|
| A | 1 | 0.4 | 118.5 | 30 | | | Ar | 250 | | |
|  | 2 | 0.1 | | 10 | | | Ar | 250 | | |
|  | 3 | 0.2 | | 5 | | | Ar | 250 | 2.72E+15 | 337 |
|  | 4 | 1 | | 2 | | | Ar | 250 | | |
|  | 5 | 0.05 | 58.8 | 7 | 5% $B_2H_6$/He | 1050 | | | | |
| B | 1 | 0.4 | | 10 | | | Ar | 250 | | |
|  | 2 | 0.2 | | 5 | | | Ar | 250 | | |

TABLE 1-continued

| Case No. | Step No. | GCIB Dose (1 × 10¹⁵) | $I_{FC}$ (μA) | Energy (keV) | Gas 1 | Flow Rate 1 (sccm) | Gas 2 | Flow Rate 2 (sccm) | B Dose (atoms/sc) | Penetration Depth (A @ 1 × 10¹⁸) |
|---|---|---|---|---|---|---|---|---|---|---|
|  | 3 | 1 |  | 2 |  |  | Ar | 250 | 2.06E+15 | 233 |
|  | 4 | 0.05 | 58.8 | 7 | 5% $B_2H_6$/He | 1050 |  |  |  |  |
| C | 1 | 0.05 | 59.3 | 7 | 5% $B_2H_6$/He | 1050 |  |  | 6.26E+14 | 105 |

The first profile (labeled in FIG. 5B as "7 kV 5% $B_2H_6$/He, only") is provided as Case C in Table 1. In the first profile, B is infused within a silicon substrate using a single GCIB step comprising 5% by molar concentration $B_2H_6$ in He at a flow rate of 1050 sccm (standard cubic centimeters per minute), a beam energy of 7 keV, a GCIB dose of 0.05×10¹⁵ charge/sc and a beam current ($I_{FC}$) measured by a Faraday cup of 59.3 micro-amps (μA).

The second profile (labeled in FIG. 5B as "10 kV Ar 4E14+ smoothing+7 kV 5% $B_2H_6$/He") is provided as Case B in Table 1. In the second profile, B is infused within a silicon substrate using four (4) GCIB steps comprising: (Step 1) a GCIB step comprising Ar at a flow rate of 250 sccm, a beam energy of 10 keV and a GCIB dose of 0.4×10¹⁵ charge/sc; (Step 2) a GCIB step comprising Ar at a flow rate of 250 sccm, a beam energy of 5 keV and a GCIB dose of 0.2×10¹⁵ charge/sc; (Step 3) a GCIB step comprising Ar at a flow rate of 250 sccm, a beam energy of 2 keV and a GCIB dose of 1×10¹⁵ charge/sc; and (Step 4) a GCIB step comprising 5% by molar concentration $B_2H_6$ in He at a flow rate of 1050 sccm, a beam energy of 7 keV, a GCIB dose of 0.05×10¹⁵ charge/sc and a beam current ($I_{FC}$) measured by a Faraday cup of 58.8 micro-amps. Steps 2 and 3, including Ar GCIB treatment at lower energy, may be used to smooth the surface of the silicon substrate.

The third profile (labeled in FIG. 5B as "30 kV Ar 4E14+ smoothing+7 kV 5% $B_2H_6$/He") is provided as Case A in Table 1. In the third profile, B is infused within a silicon substrate using five (5) GCIB steps comprising: (Step 1) a GCIB step comprising Ar at a flow rate of 250 sccm, a beam energy of 30 keV, a GCIB dose of 0.4×10¹⁵ charge/sc and a beam current of 118.5 micro-amps; (Step 2) a GCIB step comprising Ar at a flow rate of 250 sccm, a beam energy of 10 keV and a GCIB dose of 0.1×10¹⁵ charge/sc; (Step 3) a GCIB step comprising Ar at a flow rate of 250 sccm, a beam energy of 5 keV and a GCIB dose of 0.2×10¹⁵ charge/sc; (Step 4) a GCIB step comprising Ar at a flow rate of 250 sccm, a beam energy of 2 keV and a GCIB dose of 1×10¹⁵ charge/sc; and (Step 5) a GCIB step comprising 5% by molar concentration $B_2H_6$ in He at a flow rate of 1050 sccm, a beam energy of 7 keV, a GCIB dose of 0.05×10¹⁵ charge/sc and a beam current ($I_{FC}$) measured by a Faraday cup of 58.8 micro-amps. Steps 2, 3 and 4, including Ar GCIB treatment at lower energy, may be used to smooth the surface of the silicon substrate.

As indicated in Table 1 and shown in FIG. 5B, the B dose and the penetration depth of the B profile are increased when the pre-treatment step is utilized. For example, the penetration depth and the B dose increases from 105 Angstroms and 6.26×10¹⁴ atoms/sc (Case C) to 233 Angstroms and 2.06×10¹⁵ atoms/sc (Case B) to 337 Angstroms and 2.72×10¹⁵ atoms/sc (Case A). Furthermore, for example, the penetration depth and dose may be increased by increasing the beam energy for the pre-treatment GCIB step.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for infusing material within a surface of a substrate, comprising:
    modifying a surface condition of a surface on a substrate to produce a modified surface layer by exposing said substrate to one or more pre-treatment gas cluster ion beams (GCIBs) comprising a noble gas element; and
    thereafter, infusing material into said modified surface layer in said substrate by exposing said substrate to a gas cluster ion beam (GCIB) comprising said material,
    wherein said modifying said surface condition effects a deeper penetration of said material into said substrate during said infusing relative to infusing said material without said modifying.

2. The method of claim 1, wherein said substrate comprises a crystalline material, and said modifying said surface condition of said surface of said substrate causes amorphization of said surface to produce said modified surface layer.

3. The method of claim 1, wherein said noble gas element is argon.

4. The method of claim 1, wherein said modifying said surface condition of said surface on said substrate further comprises:
    exposing said substrate to an ion beam to cause ion implantation, said ion beam is substantially composed of non-clustered ions; or
    exposing said substrate to plasma to cause plasma immersion ion implantation; or a combination thereof.

5. The method of claim 1, wherein said modifying comprises:
    maintaining a reduced-pressure environment around a substrate holder for holding said substrate having said surface;
    holding said substrate securely within said reduced-pressure environment;
    providing to said reduced-pressure environment said one or more pre-treatment GCIBs from a pressurized gas mixture comprising said noble gas element;
    accelerating each of said one or more pre-treatment GCIBs to a pre-treatment beam energy; and
    irradiating each of said one or more accelerated pre-treatment GCIBs onto at least a portion of said surface of said substrate to alter said surface condition of said surface.

6. The method of claim 5, wherein one or more of said pre-treatment beam energies is greater than about 5 keV.

7. The method of claim 5, wherein one or more of said pre-treatment beam energies is greater than about 10 keV.

8. The method of claim 5, wherein one or more of said pre-treatment beam energies is greater than about 20 keV.

9. The method of claim 5, wherein one or more of said pre-treatment beam energies is greater than about 30 keV.

10. The method of claim 1, wherein said one or more pre-treatment GCIBs contain said noble gas element and do not contain said material.

11. The method of claim 1, wherein said one or more pre-treatment GCIBs consist of said noble gas element.

12. The method of claim 1, wherein said one or more pre-treatment GCIBs consist of argon.

13. The method of claim 1, wherein said infusing said material comprises:
   maintaining a reduced-pressure environment around a substrate holder for holding said substrate having said surface;
   holding said substrate securely within said reduced-pressure environment;
   providing to said reduced-pressure environment said GCIB from a pressurized gas mixture comprising said material;
   accelerating said GCIB to an infusion beam energy; and
   irradiating said accelerated GCIB onto at least a portion of said modified surface layer of said substrate to infuse said material into said modified surface layer.

14. The method of claim 13, wherein said infusion beam energy is less than about 10 keV.

15. The method of claim 13, wherein said material comprises boron (B), phosphorous (P), arsenic (As), or antimony (Sb), or any combination of two or more thereof.

16. The method of claim 1, wherein a first of said one or more pre-treatment GCIBs has a beam energy greater than about 10 keV, and wherein said GCIB comprising said material has a beam energy less than said beam energy of said first of said one or more pre-treatment GCIBs.

17. The method of claim 16, wherein said first of said one or more pre-treatment GCIBs has a beam energy greater than about 20 keV, and wherein said GCIB comprising said material has a beam energy less than about 10 keV.

18. The method of claim 16, wherein each of said one or more pre-treatment GCIBs subsequent to said first has a lower beam energy than a beam energy of a preceding one of said one or more pre-treatment GCIBs.

19. A method for infusing material within a surface of a substrate, comprising:
   treating a surface on a substrate using a first GCIB consisting essentially of a noble gas element and having a first beam energy in order to modify a surface condition of said surface on said substrate to produce a modified surface layer; and
   thereafter, infusing material into said modified surface layer in said substrate by exposing said substrate to a second GCIB comprising said material and having a second beam energy that is less than the first beam energy;
   wherein said treating effects a deeper penetration of said material into said substrate during said infusing relative to infusing said material without said treating.

20. The method of claim 19, wherein said first GCIB consists of a noble gas element, and wherein said first beam energy is greater than or equal to about 10 keV.

21. The method of claim 19, wherein said second beam energy is less than or equal to about 10 keV.

22. The method of claim 19, further comprising:
   smoothing said modified surface on said substrate prior to said infusing said material.

23. The method of claim 19, further comprising:
   post-treating said substrate containing said infused material by treating said substrate with a third GCIB, treating said substrate with elevated temperature thermal annealing, treating said substrate with pulsed laser beam annealing, or treating said substrate with pulsed electron beam annealing, or any combination of two or more thereof.

24. The method of claim 19, further comprising:
   forming a patterned mask layer on said substrate prior to treating said surface on said substrate using said first GCIB in order to cause patterning of the distribution of said modified surface layer; and
   removing said patterned mask layer prior to infusing said material into said patterned modified surface layer by exposing said substrate to said second GCIB in order to cause patterning of the distribution of an infusion depth of said material, or an infusion dose of said material, or both.

25. The method of claim 19, wherein said first beam energy is greater than about 10 keV and said second beam energy is less than about 10 keV.

* * * * *